(12) United States Patent
Hansen et al.

(10) Patent No.: US 8,755,165 B2
(45) Date of Patent: Jun. 17, 2014

(54) FAULT TOLERANT ION SOURCE POWER SYSTEM

(75) Inventors: Dennis John Hansen, Loveland, CO (US); James David Deakins, Fort Collins, CO (US); Curtis Charles Camus, Fort Collins, CO (US)

(73) Assignee: Veeco Instruments, Inc., Plainview, NY (US)

( * ) Notice: Subject to any disclaimer, the term of this patent is extended or adjusted under 35 U.S.C. 154(b) by 912 days.

(21) Appl. No.: 12/906,756

(22) Filed: Oct. 18, 2010

(65) Prior Publication Data

US 2012/0091914 A1 Apr. 19, 2012

(51) Int. Cl.
*H05B 37/02* (2006.01)

(52) U.S. Cl.
USPC .......................................... 361/235

(58) Field of Classification Search
USPC .......................................... 361/235
See application file for complete search history.

(56) References Cited

U.S. PATENT DOCUMENTS

| | | | |
|---|---|---|---|
| 5,432,666 A * | 7/1995 | Hodge | 361/19 |
| 6,259,210 B1 * | 7/2001 | Wells | 315/111.81 |
| 2004/0032295 A1 | 2/2004 | Wolkstein et al. | |
| 2007/0121258 A1 | 5/2007 | Hachiya | |
| 2007/0164680 A1 | 7/2007 | Kumar et al. | |
| 2008/0043383 A1 | 2/2008 | Shah et al. | |
| 2008/0055796 A1 | 3/2008 | Chu et al. | |
| 2008/0067354 A1 | 3/2008 | Gabeler | |
| 2008/0129209 A1 * | 6/2008 | Deakins et al. | 315/111.91 |
| 2008/0157681 A1 | 7/2008 | Huang et al. | |

OTHER PUBLICATIONS

International Searching Authority, U.S. Patent and Trademark Office, International Search Report for PCT/US2011/056546 dated May 7, 2012, 3 pages.
International Searhing Authority, U.S. Patent and Trademark Office, Written Opinion for PCT/2011/056546, dated May 7, 2012, 5 pages.

* cited by examiner

*Primary Examiner* — Jared Fureman
*Assistant Examiner* — Kevin J Comber
(74) *Attorney, Agent, or Firm* — HolzerIPLaw, PC (57) ABSTRACT

The presently disclosed technology provides a responsive ion beam source power supply system capable of handling fault events without relying on conventional protection circuitry (e.g., fuses and breakers) so that physical power supply hardware intervention by a user is minimized for typical fault conditions and the ion beam source power supply system may recover automatically after experiencing a fault condition. The presently disclosed technology further discloses an ion beam source power supply system capable of detecting and diagnosing fault states, autonomously implementing command decisions to preserve or protect the function of other ion source modules or sub-systems, and/or mitigating or recovering from the disruptive fault event and returning the ion beam source system to desired user settings.

29 Claims, 8 Drawing Sheets

| Faulting Power Supply | VAC-DC Converter 562 | FC Source 522 | Discharge Source 526 | Beam Grid 532 | Accelerator Grid 538 | Decelerator Grid 544 | PBN FC 548 | PBN BODY 554 | PBN Emitter 556 |
|---|---|---|---|---|---|---|---|---|---|
| VAC-DC Converter 562 | Input Phase loss/sag → Reduce C.L. | Input VAC Phase loss or sag → INTRPT: System OFF | | | Input VAC Phase loss or sag → INTRPT: System idle or OFF | | | Input VAC Phase loss or sag → INTRPT: System idle or OFF | |
| FC Source 522 | --- | INTRPT: System OFF | INTRPT: Disch. OFF | INTRPT: Beam OFF | | Interconnect short → INTRPT: System OFF | | | |
| Discharge Source 526 | --- | | HS INTRPT* Beam OFF | N/A | | | | | |
| Beam Grid 532 | --- | | | HS INTRPT* Beam OFF | INTRPT: Beam to Idle or OFF | | Interconnect short → INTRPT: System OFF | | |
| Accelerator Grid 538 | --- | | | | INTRPT: Grid Supplies to idle or OFF | INTRPT: Accel. & Decel. to Idle or Grid OFF | Interconnect short → INTRPT: System OFF | | HS INTRPT* Accel. OFF |
| Decelerator Grid 544 | --- | | | | | INTRPT: Grid Supplies to idle/OFF | Interconnect short → INTRPT: System OFF | | HS INTRPT* Decel OFF |
| PBN FC 548 | --- | | | | | | | INTRPT: PBN and Grid OFF | |
| PBN BODY 554 | --- | | | | | | | INTRPT: PBN and Grid OFF | HS INTRPT* Beam OFF |
| PBN Emitter 556 | --- | *High Speed Interrupts (HS INTRPT) may be followed by Controller Interrupts (INTRPT) to take further actions to idle or shut down appropriate power supplies. | HS INTRPT* Beam OFF | | INTRPT: Grid Supplies to idle or OFF | INTRPT: Grid Supplies to idle or OFF | | HS INTRPT*: Beam OFF or INTRPT: PBN and Grid OFF | |
| Ground 582 | Tripped input breaker | INTRPT: FC, Discharge, and Beam OFF | | | | | | | |

FAULT TOLERANT ION SOURCE POWER SYSTEM

BACKGROUND

Ion sources are widely used to generate ion beams in materials processing applications. Such ion sources often include grid optics to produce an ion beam with a relatively narrow range of ion energy. The ion sources also often have features to help control spatial and charged state attributes of the ion beam such as beam current density or flux, uniformity or spread, divergence or focus, and neutralization.

The ion beams serve a wide variety of materials processing applications including ion beam sputtering, ion milling, surface etching, ion assist during deposition, surface texturing, and pre-cleaning in order to pattern, produce, or "grow" various surface structures or alter surface properties on a substrate. Such ion beams are also used in a host of direct or indirect thin film deposition processes including ion beam physical vapor sputter deposition and direct film deposition (e.g., silicon carbon based or diamond like carbon coatings). The ion beams may also be used as an energetic ion assist to magnetron, e-beam evaporator, or secondary ion beam deposition processes for the formation of either conductive or dielectric films. Example ion beam source applications include ion beam milling and/or etching of surface layers to from sub-micron features within data-storage read/write heads. Another example is using one or more ion sources for deposition and densification of oxides, nitrides or fluoride-based thin films onto an optical substrate while impinging the same substrate with a secondary "assist" ion beam in order to produce films with high optical index and clarity and with controlled material properties such as adhesion, stress, or density. Yet another example of using an ion beam for materials processing includes surface treatment of moving architectural glass substrates undergoing vacuum based processing, or metal or polymer films in a vacuum web coating system. In such example implementations, ion beam(s) can be used for surface cleaning, texturing, deposition assist, surface chemistry activation, and/or the formation or growth of nanometer-scaled surface structures.

The ion beam sources often incorporate a low pressure, electrically excited gas discharge (or gaseous plasma) that is driven by the inputs of multiple electrical power supplies having a variety of power handling characteristics. Each ion beam source may further include one or more grids that electrically extract and form the ion beam. In another implementation, each ion beam source may include magnetic fields in close proximity to a positive anode body to support a plasma space-charge that is used to form an ion beam. Typically, one or more power supplies, which form an ion source power supply system, initiate and sustain an electrically excited gas discharge body to form the ions, extract and accelerate the ions to form an ion beam, and further assist in neutralization of the electrical space charge of the ion beam.

Ion source power supply systems may include one or more sub-systems that are electrically coupled with each other through some form of plasma or gas-discharge impedance. These sub-systems are susceptible to shorting events or open faults between components of the power supply system, which can lead to damage of one or more power supplies involved in the fault and/or will shut down of the ion source power supply system. Further, the power supplies may also be susceptible to input line "fault" conditions such as loss of a voltage alternating current (VAC) phase (from a three phase input) or a line sag, when the voltage to one or more of the input VAC line phases drops below a minimum value. In one implementation, this low input VAC condition causes a diminished power handling capacity of a VAC-DC converter supporting a DC bus, which delivers power to various ion source power supply modules. Existing approaches for protecting multiple and different power supplies against the numerous varieties of potential fault conditions involve sizeable power absorbing protection circuitry at the outputs of each power supply, which introduces excess cost to the ion source power supply systems. Moreover, such existing approaches do not intelligently mitigate persistent or transient fault conditions and do not automatically recover from a fault event/condition and return the ion source power supply system (and thereby the ion source) to a desired state of operation.

SUMMARY

Implementations described and claimed herein address the foregoing problems by providing a method of managing power within an ion source system. The method may include detecting a fault at an input of a power signal to a first power supply of the ion source system, identifying a second power supply of the ion source contributing to the fault, and signaling the second power supply to alter its power output.

Implementations described and claimed herein address the foregoing problems by providing an ion source system. The system may include a first power supply configured to receive a fault; a second power supply contributing to the fault; and a controller configured to detect the fault at the first power supply, identify the second power supply, and signal the second power supply to alter its power output.

Other implementations are also described and recited herein.

DETAILED DESCRIPTIONS

Figure 1:
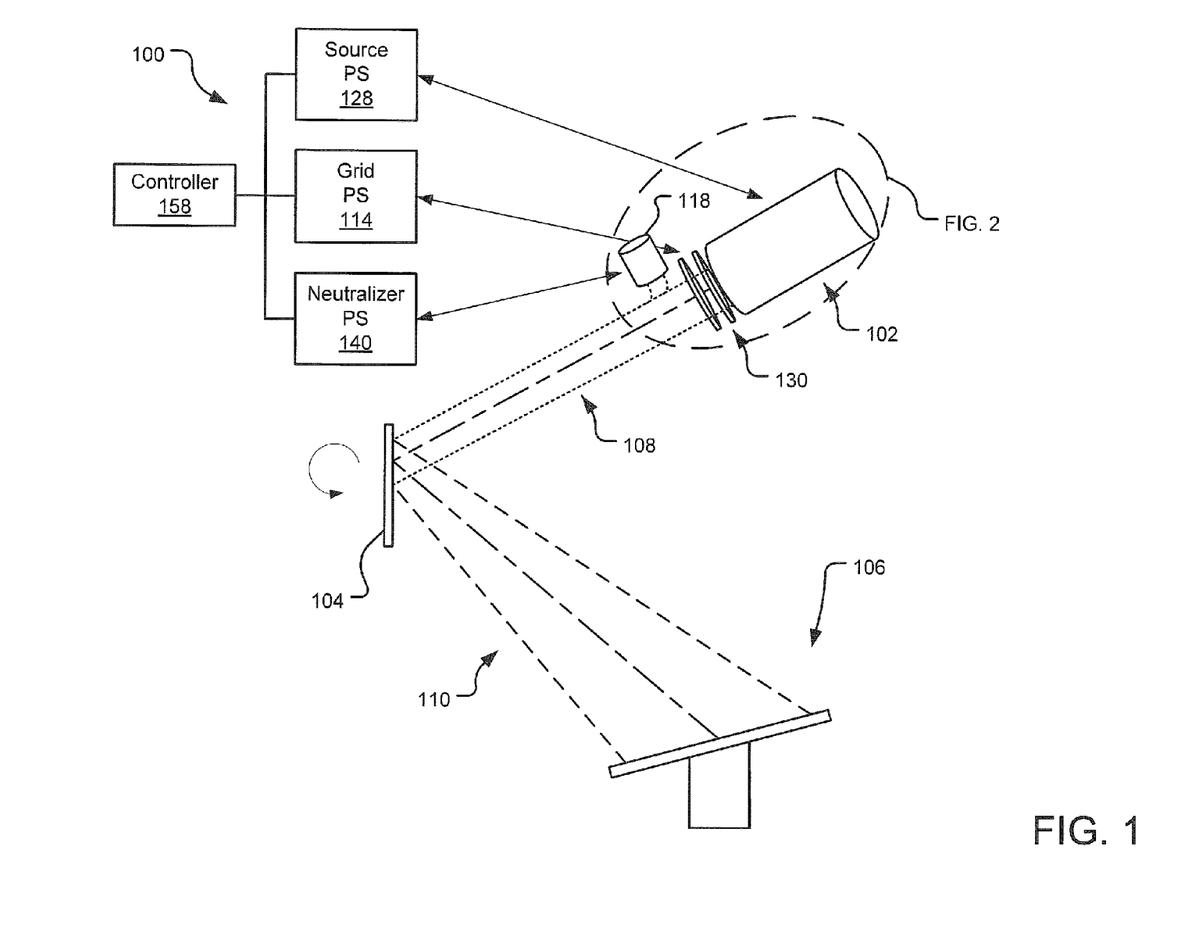
FIG. 1 illustrates an example ion beam system implementing the presently disclosed technology.

FIG. 1 illustrates an example ion beam system 100 implementing the presently disclosed technology. Even though the implementation of the ion beam system 100 is implemented as an ion beam sputter deposition system, components of the ion beam system 100 may also be used with some alteration for implementing an ion beam etch system, an ion implantation system, an ion beam deposition system, etc.

The ion beam system 100 includes an ion beam source 102 (depicted in more detail in FIG. 2), a work-piece 104, and a substrate 106 in an example application configuration. The ion beam source 102 generates an ion beam 108. A plurality of grids 130 are positioned in the path of the ion beam 108. Such grids 130 focus the ion beam 108 on the work-piece 104 in a desired manner. In addition, an electron source or neutralizer 118 is often included downstream of the grids 130. The ion beam 108, upon striking the work-piece 104 generates a plume 110 of sputtered material from a target affixed to the work-piece assembly 104. The ion beam 108 strikes the work-piece 104 at such an angle so that the sputtered plume 110 generated from the work-piece 104 travels towards the substrate 106. The substrate 106 is located such that the sputtered plume 110 strikes the substrate 106 at a desired angle.

Figure 2:
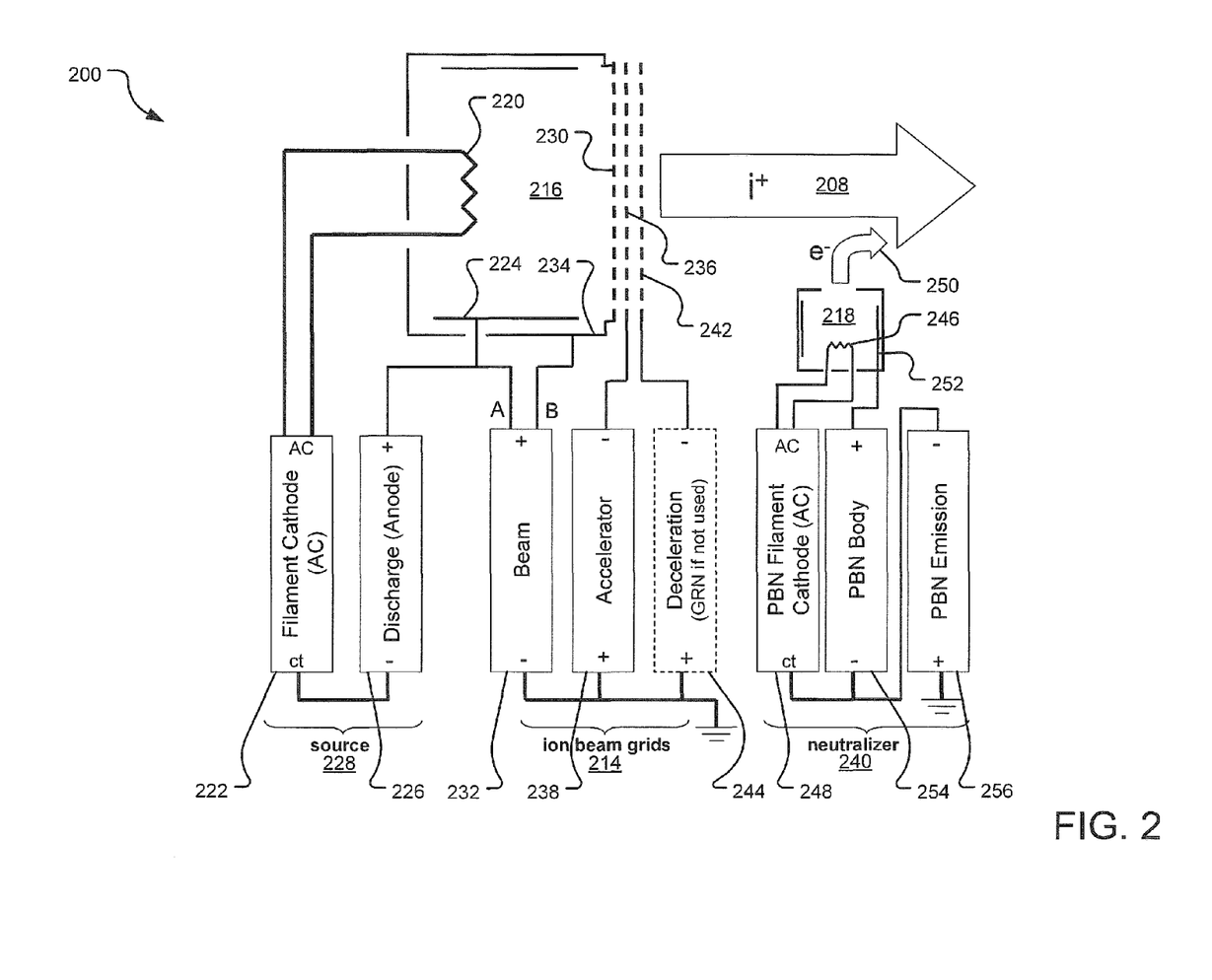
FIG. 2 illustrates an example ion source power system implementing the presently disclosed technology.

Ion beam source systems (e.g., ion beam source 102) that employ grid optics are often driven with multiple power supplies (e.g., PS 128, 114, 140) for producing an ion source gas discharge, extracting ions, forming an ion beam, for neutralizing the ion beam space charge properties, and/or for surface neutralization. The power supplies (PS) are often interconnected to a central controller 158 that controls the operation of the ion beam system 100. A more detailed example of such a system of coupled power supplies is shown in FIG. 2.

The ion source power supplies may be generally divided into three categories: (1) ion source discharge power supplies (e.g., source PS 128); (2) ion beam grids or grid optic power supplies (e.g., grid PS 114); and (3) ion beam neutralizer power supplies (e.g., neutralizer PS 140). Together, these grouped power supplies or supply sub-systems comprise an ion beam power supply system. The ion source discharge power supply may be based on direct current (DC), alternating current (AC), radio frequency (RF) and/or microwave power. Ion beam grid optics often use multiple DC power supplies to provide DC electrostatic fields within a plurality of grids for ion extraction, acceleration, and collimation and focusing of the ion beam. Accelerated, positively charged ions (collectively, an ion beam) exiting the grid often utilize a source of negatively charged electrons to neutralize the positive space charge of the ion beam. This source of electrons is commonly referred to as a neutralizer 118. Besides neutralizing the ion beam, the neutralizer may also supply electrons to downstream work surface(s). The downstream work surface(s) may positively charge-up and discharge, which can cause charge-induced damage to the ion beam system and/or downstream work surface(s).

These power supplies often include self-protection features (e.g., over-voltage protection and/or over-current protection) from unexpected, yet possible electrical shorting events (including mis-wiring and mis-assembly) between electrical connections of any of two or more of a variety of ion source power supplies and a system ground. These "shorting events" may be referred to as electrical "faults."

Ion beam power supply systems typically employ either (a) an array of separate discrete power modules with separate output fault protection and separate input VAC line power sections, and/or (b) an integrated array of modular power supplies sharing a common input VAC line power or DC rectified bus and with individualized over-voltage/over-current fault protection features (e.g., fuses, "crow-bar" circuitry, and arc protection circuitry) designed for each modular power supply.

FIG. 2 illustrates an example ion source power system 200 implementing the presently disclosed technology. The ion source power system 200 utilizes a powered ion source component 228, a powered beam grid component 214 for drawing, accelerating and collimating an ion beam 208, and a neutralizer component 240 for neutralizing the ion space charge of the extracted ion beam 208. While the powered neutralizer 240 is often included in ion source power systems such as system 200, some ion beam process applications generate free secondary electrons via energetic ion impingement of a treated surface by the ion beam, which are sufficient to provide neutralizing electrons into the downstream ion beam process without a powered neutralizer such as neutralizer 240.

There are numerous technical variations of ion beam source systems. For instance, there are numerous types of ion source 228 designs and associated grid component 214 and neutralizer component 240 sub-systems. FIG. 2 depicts one example configuration of an ion source to demonstrate the various features of the example ion source power system 200. Other configurations of ion source power systems are contemplated herein. Specifically, the ion source power system 200 of FIG. 2 includes the following components.

The power system 200 includes an AC-heated filament cathode 220 and corresponding AC power supply 222 for thermionic emission of primary electrons within the enclosed gas discharge chamber 216. The power system 200 also includes a discharge anode 224 with a corresponding DC power supply 226 that powers a low pressure (typically<10 mTorr) gas discharge between the anode 224 and the filament cathode 220. The negative terminal on the anode power supply 226 is connected to the center tap (ct) of the cathode power supply 222. The cathode 220, anode 224, corresponding power supplies 222, 226, and the discharge chamber 216 collectively form the source component 228 of the ion source power system 200.

The system 200 also includes a first "beam" grid 230 charged at a positive potential with respect to a ground potential with a corresponding first DC power supply 232 (i.e., a beam power supply 232), including an output connection to the discharge anode 224 (A) and an output connection to a chamber body 234 (B) which is in conductive contact with the first beam grid 230. A second "acceleration" grid 236 is negatively charged with respect to the beam grid 230 potential with a corresponding second DC power supply 238 for extraction of ions. A third "deceleration" grid 242 is often included in the set of ion beam girds and is typically maintained at or near ground potential. The deceleration grid 242 serves in a wide variety of purposes including shielding the screen and accelerator grids from back-sputtered process debris. The deceleration grid 242 may also allow for wider accelerator grid voltages, larger total beam current levels, and/or lower acceleration grid 236 wear rates. When not grounded, the deceleration grid 242 may be biased (typically negative by a relatively small magnitude) by a third corresponding DC supply 244. The negative terminal of the first DC power supply 232 and the positive terminals of the second DC power supply 238 and the third DC supply 244 are connected to ground potential. The beam grid 230, the acceleration grid 236, the deceleration grid 242, and the corresponding power supplies 232, 238, 244 collectively form the grid component 214 of the ion source power system 200. While the ion source of system 200 shows a three-grid ion beam optic sub-system, it is understood that the presently disclosed technology can be applied to other ion beam grid optic sub-systems such as, but not limited to, two-grid and four-grid ion beam grid assemblies.

The power system 200 also includes a "plasma bridge neutralizer" (PBN) 240 that is a downstream electron source for ion beam neutralization. The PBN 240 includes an AC filament cathode 246 and a corresponding power supply 248 for thermionic emission of neutralization electrons 250 from an enclosed neutralization chamber 218. The PBN 240 also includes a PBN anode 252 and a corresponding anode or "body" power supply 254. The negative terminal on the anode power supply 254 is connected to the center tap (ct) of the cathode power supply 248. The PBN 240 also includes a PBN emission power supply 256, which supplies a negative reference DC bias potential to both the anode and cathode power supplies 254, 248 and a ground potential for emitting the electrons 250 from the PBN 240 into the ion beam stream 208.

In this example implementation, there are eight separate power supplies used to operate the ion source power system 200. In different ion beam source system configurations, there may be greater or fewer power supplies depending on the type of ion source component, the number/type of grid optic plates/electrodes, and/or the type of downstream neutralizer, for example.

Ion source systems, such as ion source power system 200 of FIG. 2, function by multiple power supplies (e.g., power supplies 222, 226, 232, 238, 244, 248, 254, and 256) interacting through conductive electron and ion sub-gases that constitute a gas discharge within the discharge chamber 216, an ion beam (e.g., ion beam 208) and the neutralizing stream of electrons (e.g., neutralization electrons 250). In many cases multiple supply outputs are referenced to a common reference potential such as a system or vacuum chamber ground. Thus, many of the power supplies are capable of feeding (sourcing or sinking) electrical power to another power supply through low impedance plasma arcs (such as a transient arc between ion beam grid optic electrodes), shorts from conductive deposits and loosened particulates, and/or broken, worn or misassembled source hardware or electrical interconnects (such as an improperly installed filament cathode that eventually develops into an electrical short) within an ion source system. When such "shorting fault" condition(s) occur, the output of one ion source power supply (e.g., the high current cathode power supply 222) will abnormally conduct to another ion source power supply (e.g., the high voltage beam grid supply 232). Such shorting faults may cause transient or sustained over-load conditions to one or more of the power supplies and may damage the power supplies if over-voltage or over current protection (e.g., fuses) are not provided. Given the highly linked physical properties of the electrical gas discharge within an ion source system, the occurrence of faults as described above will often influence the transient load behavior of other supporting ion source supplies and may result in poor electrical regulation or control of other impacted power supplies.

"Open faults," such as an open lead to a load including an open ground fault are also possible within the ion source systems. These faults are in contrast to the "shorting fault" examples described above. Open fault conditions do not tend to induce potential damage to power supplies or engage the over-current and/or over-voltage protection circuitry of the power supply modules. However, the open fault conditions may disrupt the ion source system, which is undesirable. In one implementation, an open fault condition is detected and ion source is brought to an idle or off state in response to the detected open fault condition.

Another type of fault may also be associated with the input line voltage to the ion source system of a three-phase VAC power source that supplies power to a DC bus via a VAC-DC converter. The DC bus may serve one or more of an entire array of ion source power supplies. Within three-phase VAC input power systems, a common fault condition is a line-sag or loss of a phase. Without compensating for a line-sag or loss of a phase, other ion source system power supply modules may draw too high a current from the DC bus. In turn, this high current condition at the DC bus may draw too much power from the VAC-DC converter, leading to tripped current breakers or open fuses at the VAC input, poor DC bus regulation, and/or disruption of the ion source system operation.

Fault conditions as a whole may be referred to as a power input or power output of a power supply that is outside the power handling capability of that power supply. More specifically, a fault condition may cause input of power outside the power handling capability of a power supply into an input side, output side, communications channel, or other electrical connection of the power supply.

Figure 3:
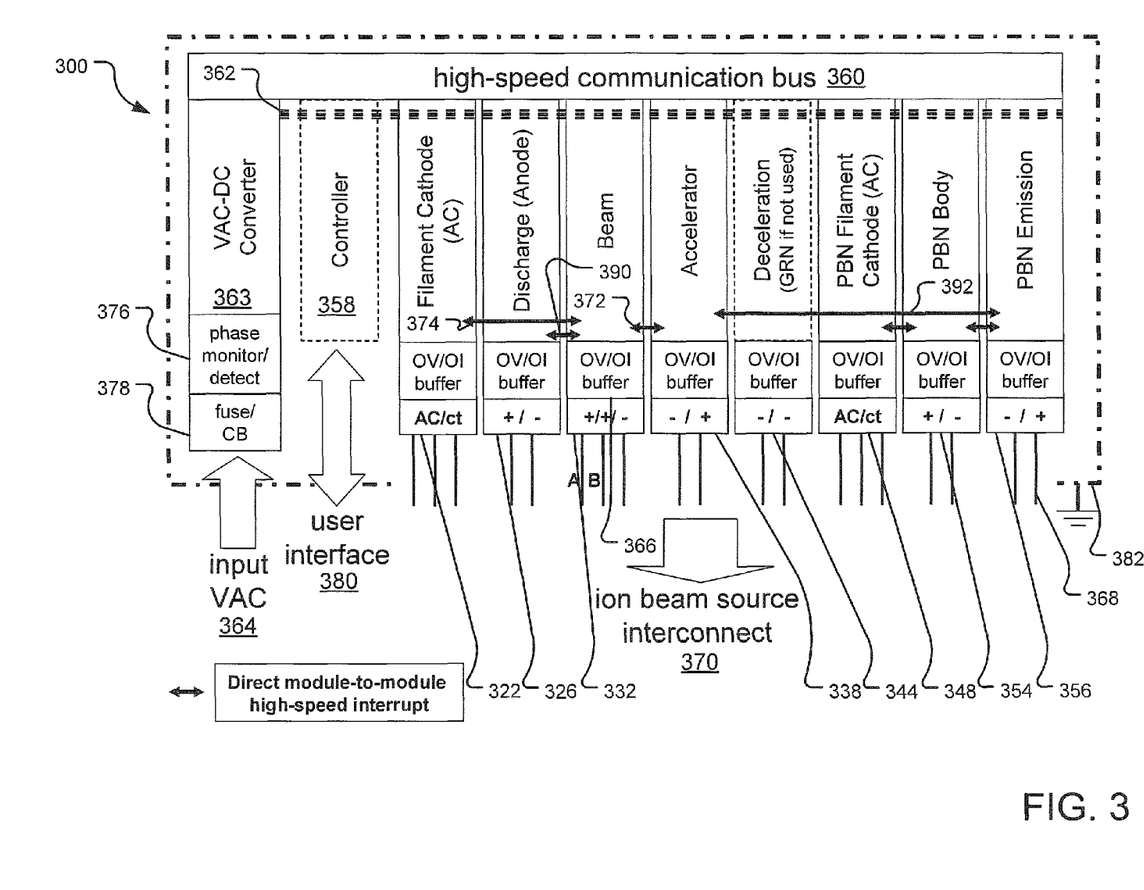
FIG. 3 illustrates an example ion source system power supply architecture implementing the presently disclosed technology.

FIG. 3 illustrates an example ion source system power supply system 300 implementing the presently disclosed technology. An array of eight power supplies 322, 326, 332, 338, 344, 348, 354, and 356 are controlled and monitored by a central controller 358 by means of a communication I/O bus 360 or a distributed communication network. A user may interact with the controller 358 via a user interface 380 to manually control, for example, set-points for power output of the power supplies. The power supply system 300 utilizes a common DC-bus 362 and a VAC-DC converter power supply 363 supported by a single VAC input 364.

In one implementation, the presently disclosed technology utilizes high-speed multi-module communications (via communication I/O bus 360) between the central controller 358 or microprocessor and individual power supplies (e.g., power supply 322). Each of the power supplies also utilize transient fault detection sense circuitry and power absorption circuitry or over-voltage/over-current (OV/OI) "buffers" (e.g., buffer 366), which may replace conventional over-current fuses and latching over-voltage protection circuitry (e.g., over-voltage "crowbar" circuits).

The buffers are sized to handle expected faults for limited duration yet can recover from such faults. Also, each power supply includes fault sense and detection circuitry to sense and report when a fault condition is occurring or has occurred. The fault sense and detection circuitry may be incorporated into the fault handling buffer circuit of each power supply. Each power supply may have two possible external communication pathways. The first external communication pathway is a fast response pathway or circuit (e.g., high-speed interrupt 372) that allows select power supplies to interrupt one another on the microsecond time scale and respond to fault events that can rapidly lead to ion source power supply or other hardware damage. The second external communication pathway is the high speed communication bus 360, whereby all the power supplies, including the input VAC/DC converter power supply 363, are tied to the central controller 358 to facilitate fault detection and remediation as described above. Output leads (e.g., lead 368) connect each of the power supplies and their respective buffers to other ion source system components (e.g., an ion source discharge, a grid-beam optic system and a downstream neutralizer) (not shown) via an ion beam source interconnect 370 and to a system ground 382.

The example ion source system power supply system 300 may detect a load fault condition at an output of any one or more of the ion source power supplies (e.g., power supply 322). Further, the power supply system 300 may utilize a transient fault handling buffer (e.g., buffer 366) for absorbing, shunting, voltage clamping and/or temporarily isolating energy from a fault condition to protect the affected power supply (e.g., power supply 322) and thereby allow time for the affected power supply to communicate to other supply modules via a high-speed interrupt or the central controller via the communication I/O bus 360 as needed to respond to the fault.

For faults requiring immediate remediation (e.g., damage may occur in less than 1 millisecond), an affected or threatened power supply may utilize a high-speed interrupt to interrupt a fault source power supply or supplies and request the fault source to temporarily reduce or eliminate its power output. As a result, the energy feeding the fault condition is reduced or eliminated. For example, in one failure mode, the relatively high-output power density capacity of the filament cathode AC power supply 322 feeds an unintended intermittent or sustained short to an electrical ground location. Such a short could electrically impact the reference potential of the cathode and could also present an unexpected, low impedance condition to the beam power supply 332. Further, such a short may require immediate remediation to protect the beam supply 332. The buffer 366 temporarily protects the power supply 332 from the high-current, low impedance condition caused by the short, while the power supply 332 requests that filament cathode AC power supply 322 reduce or eliminate its power output via high-speed interrupt 374. While the high-speed interrupt 374. would likely disrupt the ion source's operation (especially if the cathode AC power supply 322 ramped down for a significant period of time), the buffer 366 and high-speed interrupt 374 would be able to respond in a period that would protect the beam power supply 332 from an immediate risk of damage caused by the fault event.

For faults requiring remediation within 1-100 milliseconds, a high-speed interrupt may be unnecessary. An affected power supply may communicate with the central controller/processor 358 via the high speed bus 360, where the fault event condition can be examined against a fault state table or algorithm (see e.g., FIG. 4) and where the central controller/processor 358 can override user settings and re-task any single or multiple set of ion source beam power supplies to set-point conditions chosen to resolve the fault condition.

An affected power supply may also utilize a high-speed interrupt and/or the central controller/processor 358 to resolve transient fault conditions (e.g., a short duration arc or a transient short). Further, after the transient fault condition is resolved, the power supply system 300 may recover from disrupted operation due to the transient fault and return power outputs of the power supplies to a user's targeted set points.

An affected power supply may also utilize a high-speed interrupt and/or the central controller/processor 358 to resolve a prolonged fault or repeated cycle of transient faults (e.g., long duration shorts, bursts of repeated/periodic arcing, or an irreversible shorting hardware condition). Further, after the transient fault condition is resolved, the power supply system 300 may safely shut down the ion beam source system without damage to the any of the power supplies.

The ion source power system's VAC-DC converter power supply 363 may also monitor the input VAC 364 phase loss/balance for faults via a phase monitor/detect module 376 and adjust output current limits of the VAC-DC converter power supply 363 to maintain DC-bus 362 regulation. The VAC-DC converter power supply 363 may also communicate any faults to the central processor 358 via the high speed communication bus 360. The central controller/processor 358 may override user settings and re-task one or more power supplies to lower power consumption without an irreversible disruption of ion source operation. The VAC-DC converter power supply 363 may also be equipped with a fuse or circuit breaker 378 to prevent excessively high input VAC current draw by the VAC-DC converter power supply 363 from the VAC input 364.

One example fault condition is a loss of input VAC phase. Should this occur, the detection circuitry 376 monitoring the phase and balance of the incoming VAC input 364 to the VAC-DC converter 363 sends an interrupt to the central controller 358 and sends a signal to current limit circuitry of the VAC-DC converter 363. This action protects the VAC-DC converter from an excessively high current draw. However, it also reduces the maximum power and current capacity of the of the VAC-DC converter 363 feeding the DC bus 362. Thus, should the array of ion source power supply modules be drawing too high a power (or current) from the DC bus 362, the power regulation by the VAC-DC converter 363 could be further negatively impacted by the low VAC input fault.

In a time period it takes for the ion source power supplies to see the drop in available current from the VAC-DC converter power supply 363, the central controller 358 registers the VAC input power line fault and may override user set-points of one or more of the ion beam source power supplies to bring the ion source system 300 to a lower power consumption idle state. Further, the central controller 358 may also shut off the grid power supplies 332, 338, & 344. If the VAC line fault clears, because for example the fault was the result of a transitory loss of phase or temporary line sag, then the central controller 358 may re-task the ion source power supplies to re-establish the user's desired set points. Alternatively, if the VAC line fault persists, the central controller 358 may time out, warn the user, and/or sequentially power down the ion source power supplies in a safe and sequential manner (e.g., the grid power supplies followed by the source power supplies followed by the neutralizer power supplies).

Another example fault condition is a source discharge anode 326 to ground 382 short. Since the discharge anode power supply 326 and the beam grid power supply 332 are electrically connected together, this ground fault condition may lead to internal damage of output components (e.g., a "body" resistor at output connection A of 332 which may be connected to the positive lead of discharge anode power supply 326) within the beam grid power supply 332 by exceeding the over-current protection of the beam grid power supply 332 provided by the corresponding OV/OI buffer. Since the damage may occur quickly, a high-speed interrupt 390 is sent to the discharge anode power supply 326 to immediately power down to prevent output component damage. Further, an interrupt may be simultaneously sent to the central controller 358. With the disruption of the beam grid power supply 332 and possibly the anode discharge power supply 326, the central controller 358 may accesses the state of the fault condition and make further decisions regarding fault mitigation such as fully powering down one or more affected power supplies or re-tasking the array of ion source power supplies to lower power idle-mode states in an attempt to mitigate the fault or recover from a transitory fault event.

Yet another example fault condition is an unexpected plasma arc event between the neutralizing PBN emission power supply 356 (which may be current regulated) and the accelerator grid power supply 338 (which may be voltage regulated). These power supplies may differ in output current capacity. Specifically the current-regulated emission power supply 356 can rapidly over-drive the voltage regulated accelerator grid power supply 338 during the fault condition. In response to this fault condition, the OI buffer protection of the accelerator grid supply 338 may be activated and a high-speed interrupt 392 may be sent to the PBN emission supply 356 directing it to shut down. In addition, an interrupt may be sent to the central controller 358 to take further remediation action such as idle or power down the beam grid power supply 332 (or sub-system of grid power supplies 332, 338, 344) in order to mitigate or halt the fault condition.

Still another example fault condition is a rapid periodic (sometimes random) succession of short fault events indicating low energy density arcing events between two of the gird plates and/or ground 382. The fault condition may be induced by flake of material or deposit between grids within the ion source system 300. The central controller 358 detects the succession of "bursts" of multiple interrupts. The central controller 358 may handle these faults via the high-speed communication bus 360 or alternatively may monitor the state of the recovering OV/OI buffer circuitry as affected power supplies attempt to handle the short "burst" of fault events without fully shutting down the grid supplies 332, 338, 344. After a period of time or a specified fault count number, the central controller 358 may re-task the grid power supply sub-system 332, 338, 344 and/or the source power supply sub-system 322, 326 to an idle state as a means to mitigate the burst of fault events. This may be done until the central controller 358 determines that the idle state does not abate the burst of faults and shuts down the ion source system or that the fault events are abated and the ion source system may be returned to its user defined set-points.

The discussion above is directed specifically to the ion source power systems depicted in FIGS. 1-3, however, other ion source system types and arrangements may utilize the presently disclosed technology. These ion source systems, include but are not limited to the following: 1) a DC ion source with a filament cathode, DC grids, and a DC filament cathode neutralizer; 2) a DC ion source with a filament cathode, DC grids, and a hollow cathode neutralizer; 3) a DC ion source with a hollow-cathode, DC grids, and various neutralizers (e.g., a DC filament, a PBN, a hollow-cathode electron emitter, and/or a radio frequency (RF) neutralizer); 4) an RE capacitively-coupled ion source, with DC grids and various neutralizers (e.g., a DC filament, a PBN, a hollow-cathode electron emitter, and/or an RE-neutralizer); 5) an RF inductively-coupled ion source, with DC grids and various neutralizers (e.g., a DC filament, a PBN, a hollow-cathode electron emitter, and/or an RF-neutralizer); and 6) a microwave ion source, with DC grids and various neutralizers (e.g., a DC filament, a PBN, a hollow-cathode electron emitter, and/or an RF-neutralizer). In the case of the aforementioned RF and microwave powered ion sources, protection circuitry according to the presently disclosed technology may be manifested as trigged voltage, current, phase, impedance, and/or reflected power sensors or other electrically voltage standing wave ratio (VSWR) measurements associated with RF or microwave input transmission lines or waveguides.

Figure 4:
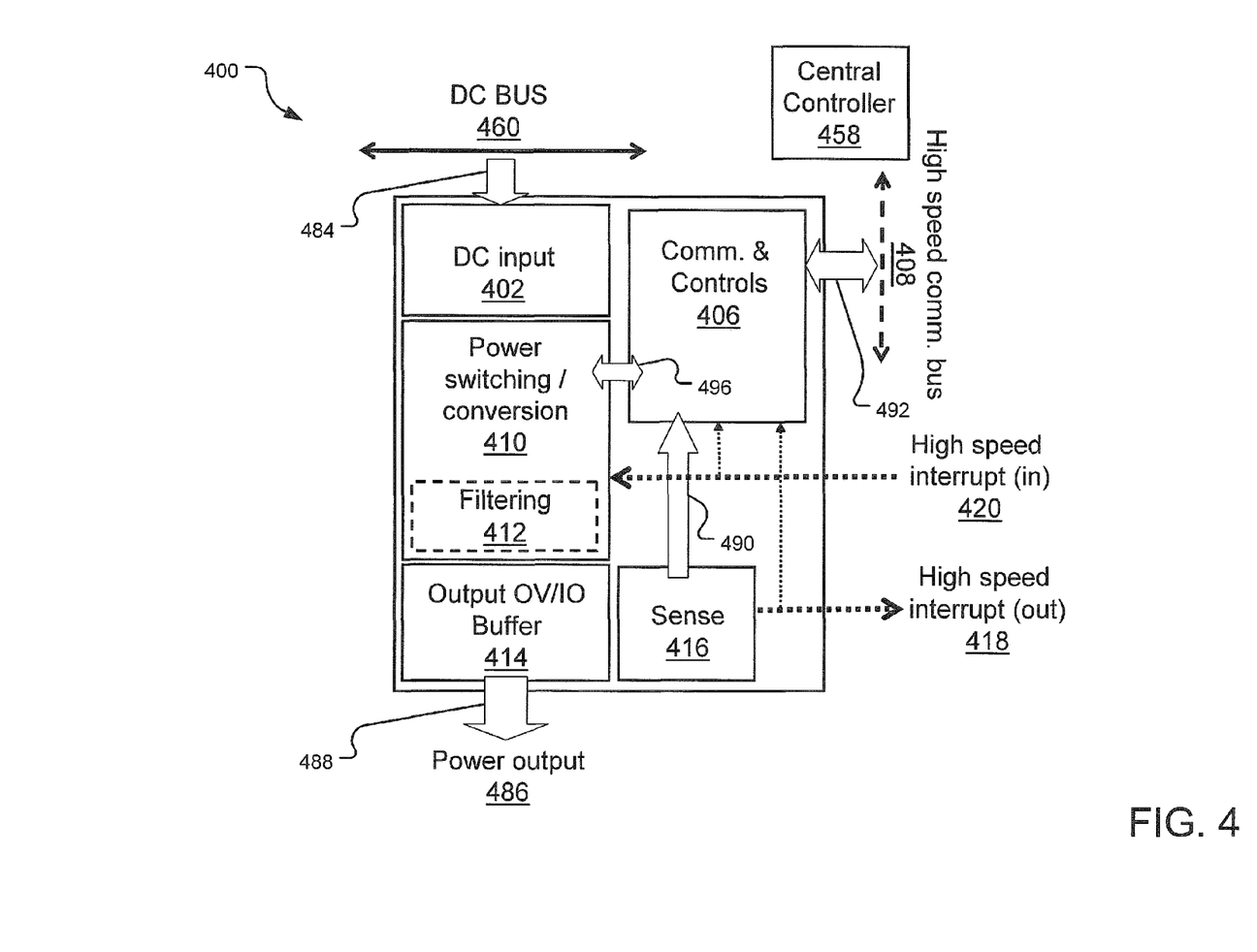
FIG. 4 illustrates an example power supply implementing the presently disclosed technology.

FIG. 4 illustrates an example power supply 400 implementing the presently disclosed technology. The power supply 400 includes a DC input module 402 (representing one or more power inputs into the power supply 400) connected to an external DC bus 460 of the power supply 400, a communication and control module 406 connected to an external high-speed communication bus 408, a power switching or conversion module 410 with an output section, which may also include passive or active output filtering and power conditioning module 412, an output over-voltage and/or over-current "buffer" protection module 414, and an output supply sensing module 416. The output section represents one or more power outputs of the power supply 400.

The power supply 400 receives DC power from the DC bus 460 into the DC input 402 via an electrical connection represented by arrow 484. The power switching/conversion module 410 performs voltage and/or current modifications to the DC power input from the DC bus 460. Further, the filter module 412 may perform further voltage and/or current modifications to the DC power input from the DC bus 460. The conditioned output from the power switching/conversion module 410 is passes through buffer module 414 before being output from the power supply 400 at power output 486, as illustrated by arrow 488. The buffer module 414 may buffer input signals feeding back into the power output 486 that constitute fault conditions as presently disclosed.

The sense module 416 is configured to sense the state of the power supply power output 486 and may also detect when the buffer module 414 is being utilized to prevent damage to the power supply 400 caused by an over-voltage, over-current, or other fault condition. The output power state(s) and any fault condition(s) detected by the sense module 416 are reported to the communication and control module 406, as illustrated by arrow 490. The communication and control module 406 controls operation of the switching/conversion module 410 (see arrow 496) and reports to an external controller 458 via the high-speed communication bus 408 (see arrow 492) when a fault condition is detected at the power supply 400.

A high-speed interrupt output signal 418 (which may be in communication with either or both of the buffer protection circuitry 414 and output sensing circuitry 416) communicates to another power module (not shown) or can even be input back to a high-speed interrupt input line 420. The high-speed interrupt input 420 is typically tied to the power switching conversion module 410 for disabling the power supply 400 operation. Also, the high-speed interrupt output 418 and input 420 signals can communicate their states to the local power supply control module 406. The power supply module 400 may utilize various responses to a fault condition depending upon its power conditioning and output specification (e.g., a DC output, an AC output, and/or an RF output). Moreover, the over-voltage or over-current buffer module 414 may also have features specific to the power supply 400. The buffer module 414 features may depend upon the protection needs (e.g., expected fault type, voltage/current/energy capacity, and expected fault duration) associated with the power supply 400, its electrical relationship to other power supplies (not shown), and its electrical function when used in conjunction with an ion beam source.

Figure 5:
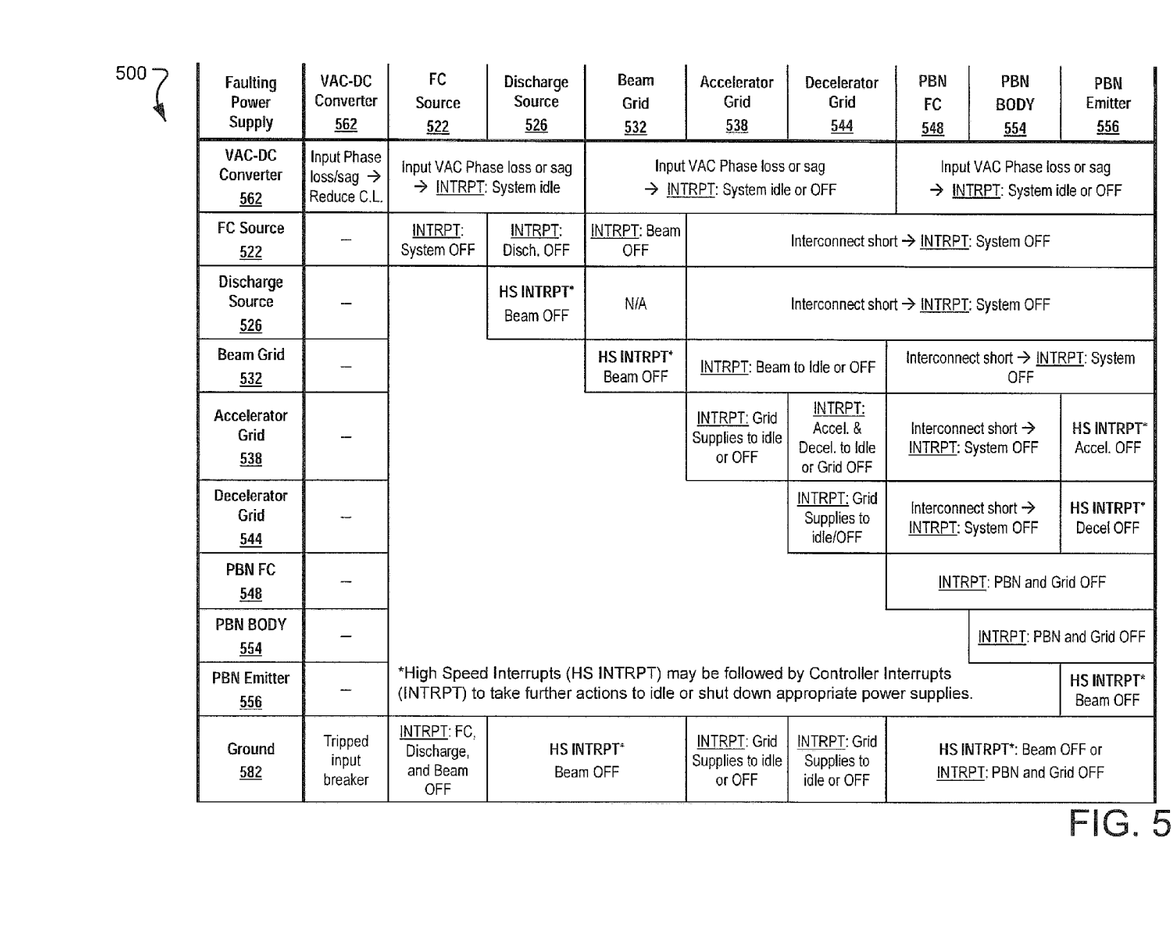
FIG. 5 illustrates a table showing example disruptive fault events and responses in an ion source system implementing the presently disclosed technology.

FIG. 5 illustrates a table 500 showing example disruptive fault events and responses in an ion source system implementing the presently disclosed technology. Power supplies (PS) 562, 522, 526, 532, 538, 544, 548, 554, & 556 are depicted on the top row and far left column of the table 500. An example fault condition or event and a response is depicted for each pair of power supplies by choosing one power supply on the top row and choosing another power supply on the far left row. The fault event occupying the same column as the first chosen power supply and the same row as the second chosen power supply corresponds to a fault condition between the two chosen power supplies. Fault responses of any single power supply are shown along the table's center diagonal while faults involving any two of the eight power supplies are shown off the table diagonal. A bottom row is added for faults involving shorting to system ground 582.

Some of the ion source system components connected to the ion source power supplies are not in close physical proximity within the ion source system. As such for some combinations of power supplies, there is a low likelihood of power supply to power supply faults as the result of some abnormally low impedance electrical conduction through the ion source discharge, beam, and/or neutralizer. However, electrical faults can occur through mis-assembly/wiring by a user and/or hardware interconnect failures. These faults are identified as "interconnect" shorts or faults and are differentiated from other faults that arise from ion source hardware failure or low impedance conduction through the ion source system, neutralizer discharges, and/or an output ion beam.

The fault events often include an over-voltage and/or over-current at an output of one of the power supplies. For example, if output leads from one power supply come in electrical contact with output leads from another power supply, an over-voltage and/or over-current input may be introduced into the output of one of the power supplies. The over-voltage and/or over-current input may engage an over-current protection (OIP) or an over-voltage protection (OVP) buffer circuitry in the affected power supply as appropriate. Further, the affected supply sends an interrupt signal (INTRPT) to a central controller while the protecting buffer circuit is engaged. The central controller may then identify one or more power supplies that may be contributing to the fault condition and deactivate or power down the contributing power supply(s). For special fault conditions requiring a very fast response time (e.g., less than 1 millisecond), a high-speed module-to-module interrupt (HS INTRPT) is activated by the buffer circuit of the affected power supply in order to request another power supply indentified as contributing to the fault to immediately deactivate or power down (e.g., shutting off its electrical switching supply gate drives or isolating its outputs). This high-speed interrupt may be followed by or concomitant with issuing the controller interrupt signal on a high-speed communication bus to the central controller.

Once the central controller receives the fault interrupt(s), it may respond directly to an identified fault source power supply or poll the affected power supplies for additional information. Depending upon the nature of the fault, the central controller may use an algorithm or state-look-up-table (e.g., table 500) to make and communicate command decisions to all the power supplies within the ion source system. Such commands decisions may include shutting down the fault affected power supplies or powering down power supply sub-sets (e.g., all grid power supplies 532, 538, 544, all neutralizer power supplies 548, 554, 556, or all source power supplies 522, 526) in a stepwise systematic sequence. In another implementation, the controller may command any one or more power supplies (or a power supply sub-set) to reduce power to a lower power "idle state" in an attempt to abate the fault condition. Should the fault condition abate, the affected OVP or OVI buffer circuitry may reverse state. The central controller can re-assess the fault condition(s) of the affected power supplies and make a determination if the fault condition(s) persist or have been successfully abated. If lower power "idle-state" commands and responses do not remove the fault, the central controller can then shut down the ion source system in a step-wise systematic sequence. Using the high-speed communication bus, central controller responses may be made within 1-100 milliseconds. As such, the reversible OVP and OIP buffer circuits are designed to safely handle fault conditions within the expected time frame of the interrupt/response period of the central controller. However, the buffer circuits may not be designed to handle continuous and/or persistent faults for time periods exceeding the expected time frame.

Referring to specific fault events involving the VAC-DC converter PS 562 on the table 500, an expected fault condition within the VAC-DC converter PS 562 is an input VAC phase loss or sag and an accompanying too-high current load demand into the VAC-DC converter PS 562. The recommended response from the central controller is to reduce the current limit within the VAC-DC converter PS 562 and further requesting the central controller to idle one or more power supplies in the ion source power system. An expected fault condition between the VAC-DC converter PS 562 and the FC source PS 522 or discharge source PS 526 is also an input VAC phase loss or sag and an accompanying too-high current load demand being drawn by the FC source PS 522 or discharge source PS 526. The recommended interrupt to the central controller from the FC source PS 522 or discharge source PS 526 is to idle the ion source system, including one or more of the power sources 522 and 526. Further, an expected fault condition between the VAC-DC converter PS 562 and the beam grid PS 532, accelerator grid PS 538, decelerator grid PS 544, PBN FC PS 548, PBN body PS 554, or PBN emitter PS 556 is also an input VAC phase loss or sag and an accompanying too-high current load demand being drawn by the beam grid PS 532, accelerator grid PS 538, decelerator grid PS 544, PBN FC PS 548, PBN body PS 554, or PBN emitter PS 556. The recommended interrupt to the central controller from the power source 532, 538, 544, 548, 554, or 556 is to idle or turn off the ion source system, including one or more of power sources 532, 538, 544, 548, 554, or 556.

Referring to specific fault events involving the FC source PS 522 on the table 500, the recommended interrupt to the central controller in response to a fault within the FC source PS 522 is to turn off the ion source system. For fault events between the FC source PS 522 and the discharge source PS 526, the recommended interrupt to the central controller is to turn off the discharge source PS 526. For fault events between the FC source PS 522 and the beam grid PS 532, the recommended interrupt to the central controller is to turn off the beam grid PS 532. For fault events between the FC source PS 522 and the accelerator grid PS 538, decelerator grid PS 544, PBN FC PS 548, PBN body PS 554, or PBN emitter PS 556, the expected fault condition is an interconnect short. The recommended interrupt to the central controller from the FC source PS 522, accelerator grid PS 538, decelerator grid PS 544, PBN FC PS 548, PBN body PS 554, and/or PBN emitter PS 556 is to turn off the ion source system.

Referring to specific fault events involving the discharge source PS 526 on the table 500, the recommended interrupt in response to a fault within the discharge source PS 526 is to immediately turn off the beam grid PS 532. An example fault related to the discharge source PS 526 could be a short between the discharge anode of the ion source system and a system ground. Due to the speed at which damage may occur to the discharge source PS 526, beam grid PS 532, or other components of the ion source system due to a fault within the discharge source PS 526, a high-speed interrupt within the discharge source PS 526 may shut off the beam grid PS 532. Further, an additional interrupt from the discharge source PS 526 to the central controller may take further actions to reduce power from or shut off other power supplies within the ion source system. Since the discharge source PS 526 and the beam grid PS 532 are in electrical contact with one another during normal operation of the ion source system, there is no expected fault condition between the discharge source PS 526 and the beam grid PS 532. For fault events between the discharge source PS 526 and the accelerator grid PS 538, decelerator grid PS 544, PBN FC PS 548, PBN body PS 554, or PBN emitter PS 556, the expected fault condition is an interconnect short. The recommended interrupt to the central controller from the discharge source PS 526, accelerator grid PS 538, decelerator grid PS 544, PBN FC PS 548, PBN body PS 554, and/or PBN emitter PS 556 is to turn off the ion source system.

Referring to specific fault events involving the beam grid PS 532 on the table 500, the recommended interrupt in response to a fault within the beam grid PS 532 (e.g., a fault between A and B poles of beam grid PS 232 of FIG. 2) is to immediately turn off the beam grid PS 532. Due to the speed at which damage may occur to the beam grid PS 532 or other components of the ion source system due to a fault within the beam grid PS 532, a high-speed interrupt within the beam grid PS 532 may shut the beam grid PS 532 off. Further, an additional interrupt from the beam grid PS 532 to the central controller may take further actions to reduce power from or shut off other power supplies within the ion source system. For fault events between the beam grid PS 532 and the accelerator grid PS 538 or decelerator grid PS 544, the recommended interrupt to the central controller is to idle or turn off the beam grid PS 532. For fault events between the beam grid PS 532 and the PBN FC PS 548, PBN body PS 554, or PBN emitter PS 556, the expected fault condition is an interconnect short. The recommended interrupt to the central controller from the beam grid PS 532, PBN FC PS 548, PBN body PS 554, and/or PBN emitter PS 556 is to turn off the ion source system.

Referring to specific fault events involving the accelerator grid PS 538 on the table 500, the recommended interrupt to the central controller in response to a fault within the accelerator grid PS 538 (e.g., a ground short) is to reduce the power state of the grid power supplies 532, 538, & 544 to idle or turn the grid power supplies 532, 538, & 544 completely off. For fault events between the accelerator grid PS 538 and the decelerator grid PS 544, the recommended interrupt to the central controller is to reduce the power state of the accelerator grid PS 538 and the decelerator grid PS 544 to idle or turn the accelerator grid PS 538 and the decelerator grid PS 544 completely off. For fault events between the accelerator grid PS 538 and the PBN FC PS 548 or PBN body PS 554, the expected fault condition is an interconnect short. The recommended interrupt to the central controller from the accelerator grid PS 538, PBN FC PS 548, and/or PBN body PS 554 is to turn off the ion source system. The recommended interrupt in response to a fault between the accelerator grid PS 538 and the PBN emitter PS 556 is to immediately turn off the accelerator grid PS 538. Due to the speed at which damage may occur to the accelerator grid PS 538, PBN emitter PS 556, or other components of the ion source system due to a fault between the accelerator grid PS 538 and the PBN emitter PS 556, a high-speed interrupt may shut off the accelerator grid PS 538. Further, an additional interrupt from the accelerator grid PS 538 and/or the PBN emitter PS 556 to the central controller may take further actions to reduce power from or shut off other power supplies within the ion source system.

Referring to specific fault events involving the decelerator grid PS 544 on the table 500, the recommended interrupt to the central controller in response to a fault within the decelerator grid PS 544 (e.g., a ground short) is to reduce the power state of the grid power supplies 532, 538, & 544 to idle or turn the grid power supplies 532, 538, & 544 completely off. For fault events between the decelerator grid PS 544 and the PBN FC PS 548 or PBN body PS 554, the expected fault condition is an interconnect short. The recommended interrupt to the central controller from the decelerator grid PS 544, PBN FC PS 548, and/or PBN body PS 554 is to turn off the ion source system. The recommended interrupt in response to a fault between the decelerator grid PS 544 and the PBN emitter PS 556 is to immediately turn off the decelerator grid PS 544. Due to the speed at which damage may occur to the decelerator grid PS 544, PBN emitter PS 556, or other components of the ion source system due to a fault between the decelerator grid PS 544 and the PBN emitter PS 556, a high-speed interrupt may shut off the decelerator grid PS 544. Further, an additional interrupt from the decelerator grid PS 544 and/or the PBN emitter PS 556 to the central controller may take further actions to reduce power from or shut off other power supplies within the ion source system.

Referring to specific fault events involving the PBN FC PS 548 on the table 500, for fault events involving only the PBN FC PS 548 or fault events between the PBN FC PS 548 and the PBN body PS 554, or PBN emitter PS 556, the recommended interrupt to the central controller is to turn off the grid power supplies 532, 538, & 544 and the PBN power supplies 548, 554, & 556. Referring to specific fault events involving the PBN body PS 554 on the table 500, for fault events involving only the PBN body PS 554 or fault events between the PBN body PS 554 and the PBN emitter PS 556, the recommended interrupt to the central controller is to turn off the grid power supplies 532, 538, & 544 and the PBN power supplies 548, 554, & 556. Referring to a specific fault event involving only the PBN emitter PS 556 on the table 500, the recommended interrupt in response to a fault within the PBN emitter PS 556 (e.g., a ground short) is to immediately turn off the beam grid PS 532. Due to the speed at which damage may occur to the PBN emitter PS 556 or other components of the ion source system due to a fault within the PBN emitter PS 556, a high-speed interrupt within the PBN emitter PS 556 may shut the output ion beam off. Further, an additional interrupt from the PBN emitter PS 556 to the central controller may take further actions to reduce power from or shut off other power supplies within the ion source system.

Referring to specific fault events involving a fault to ground 582 on the table 500, a fault from the VAC-DC converter PS 562 to ground 582 will likely result in a tripped input breaker. The recommended interrupt to the central controller in response to a fault from the FC source PS 522 to ground 582 is to turn off the FC source PS 522, discharge source PS 526, and the beam grid power supply 532. The recommended interrupt in response to a fault from the discharge source PS 526 or beam grid PS 532 to ground 582 is to immediately turn the beam grid PS 532 off. Due to the speed at which damage may occur to the discharge source PS 526, beam grid PS 532, or other components of the ion source system due to the discharge source PS 526 or beam grid PS 532 ground fault, a high-speed interrupt is sent directly to the beam grid PS 532. Further, an additional interrupt from the discharge source PS 526 or beam grid PS 532 to the central controller may take further actions to reduce power from or shut off other power supplies within the ion source system.

The recommended interrupt to the central controller in response to a fault from the accelerator grid PS 538 to ground 582 is to turn off or idle the grid power supplies 532, 538, & 544. The recommended interrupt to the central controller in response to a fault from the decelerator grid PS 544 to ground 582 is to turn off or idle the grid power supplies 532, 538, & 544. The recommended interrupt in response to a fault from the PBN FC PS 548, PBN body PS 554, or PBN emitter PS 556 to ground 582 is to immediately turn the beam grid PS 532 off and/or send an interrupt to the central controller to turn the PBN power supplies 548, 554, 556 and beam grid PS 532 off. Due to the speed at which damage may occur to the PBN power supplies 548, 554, 556 or other components of the ion source system due to the ground fault, a high-speed interrupt is sent directly to affected PBN power supply. Further, an additional interrupt from the affected PBN power supply to the central controller may take further actions to reduce power from or shut off other power supplies within the ion source system.

Figure 6:
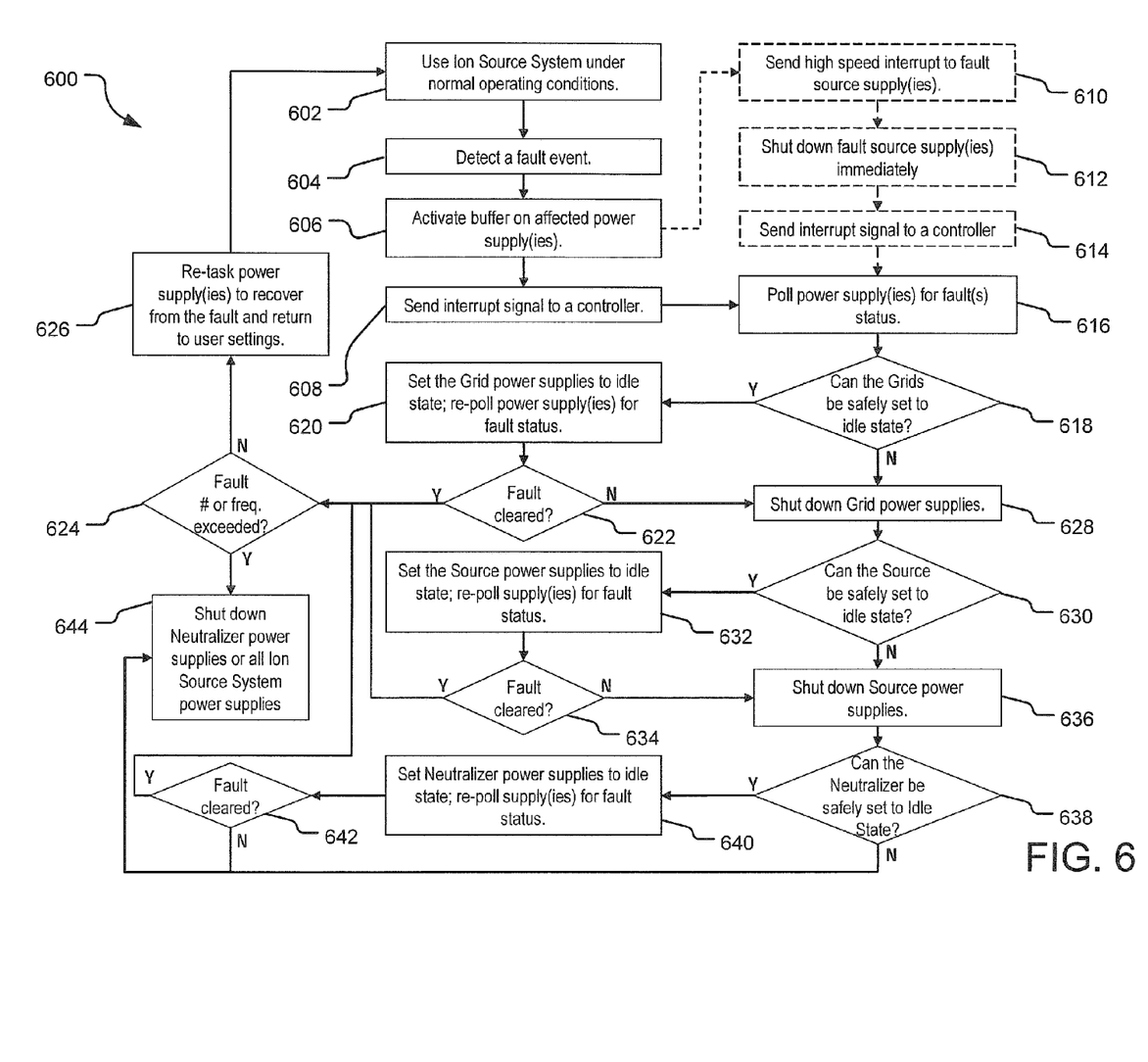
FIG. 6 illustrates an example flowchart of response and recovery events in an ion source system implementing the presently disclosed technology.

FIG. 6 illustrates an example flowchart 600 of response and recovery events in an ion source system implementing the presently disclosed technology. Various implementations of the presently disclosed technology does not utilize all the response and recovery events depicted in flowchart 600. Using operation 602 operates the ion source system under normal operating conditions. During normal operation, the ion source system may experience a fault condition (i.e., an input of a power signal outside of a power handling capability range of a particular power supply) at one or more of its power supplies. Detecting operation 604 detects the fault condition at an affected power supply. Activating operation 606 activates a buffer that buffers the faulting power input at the affected power supply for a period of time. The buffer prevents damage to the affected power supply while a source of the fault is resolved, during the period of time. In a sending operation 608, the affected power supply sends an interrupt signal to a central controller indicating the fault condition.

In an alternative implementation, a sending operation 610 sends a high-speed interrupt directly to the power supply(ies) that are the source of the fault condition. The high-speed interrupt is utilized when damage to the affected power supply will likely occur before the central controller is able to resolve the fault condition (e.g., when the controller will not be able to act within the period of time that the buffer can protect the affected power supply). Shut down operation 612 immediately shuts down power supply(ies) that are the source of the fault condition in response to the high-speed interrupt. Further, in a sending operation 614, an interrupt signal may be sent to the central controller indicating the fault condition and/or the sent high-speed interrupt.

Once the central controller receives the interrupt signal, it may analyze the ion source system to determine an appropriate response(s). In a polling operation 616, the central controller may poll the power supplies for updated operating state information (e.g., fault condition, output vs. set-point error, etc.). By means of a comparative look-up state table or algorithm, the central controller may choose from several responses. For example, the central controller may determine that the fault is debilitating enough it may command all the ion beam power supply sub-systems (i.e., grids, source, and neutralizer) to all shut down. Alternatively, the central controller may consider in sequence whether the grids, source, and neutralizer sub-systems may be safely brought to an idle state or be completely shut down.

While any fault may cause a sequential shut down sequence of the ion source system, a typical order of examination, remediation, and sequential ion source sub-system shut down is grid power supplies, source power supplies, and then neutralizer power supplies. This particular sequence assures the initial removal of the ion beam (and associated high voltages) before the shut down of the source and neutralizer. Moreover, this sequence tends to offer a desired reverse path for ion source system recovery from a fault without risking the ill effects of an under-neutralized ion beam output. However, other systematic sequences may be used depending upon the type of ion source system and its expected fault modes and events.

More specifically, in a decision operation 618, the central controller determines if the grid power supplies can be brought to a lower voltage/current/power idle state condition. If so, in setting operation 620, an idle state command is sent to the grid power supply sub-system and the ion source system is re-polled by the central controller. If all fault conditions clear (decision operation 622) and the count or frequency of faults is below a threshold (decision operation 624), then the central controller assumes the fault was transitory in nature and continues to re-establish user set-point operation in order to recover and minimize ion beam source disruption. Re-tasking operation 626 re-tasks the disrupted power supply(ies) to recover from the fault condition and restore the ion source system to the user's setpoints and/or normal operation. In shutting-down operation 628, if the detection of the fault condition does not clear or idle state of the grid power supply sub-system cannot be achieved because of the fault condition, then the central controller may shut down the grid power supplies.

In a decision operation 630, the central controller determines if the source power supplies can be brought to a lower voltage/current/power idle state condition. If so, in setting operation 632, an idle state command is sent to the source power supply sub-system and the ion source system is re-polled by the central controller. If all fault conditions clear (decision operation 634) and the count or frequency of faults is below a threshold (decision operation 624), then the central controller assumes the fault was transitory in nature and continues to re-establish user set-point operation in order to recover and minimize ion beam source disruption. Re-tasking operation 626 re-tasks the disrupted power supply(ies) to recover from the fault condition and restore the ion source system to the user's set points and/or normal operation. In shutting-down operation 636, if the detection of the fault condition does not clear or idle state of the source power supply sub-system cannot be achieved because of the fault condition, then the central controller may shut down the source power supplies.

In a decision operation 638, the central controller determines if the neutralizer power supplies can be brought to a lower voltage/current/power idle state condition. If so, in setting operation 640, an idle state command is sent to the neutralizer power supply sub-system and the ion source system is re-polled by the central controller. If all fault conditions clear (decision operation 642) and the count or frequency of faults is below a threshold (decision operation 624), then the central controller assumes the fault was transitory in nature and continues to re-establish user set-point operation in order to recover and minimize ion beam source disruption. Re-tasking operation 626 re-tasks the disrupted power supply(ies) to recover from the fault condition and restore the ion source system to the user's set points and/or normal operation. In shutting-down operation 636, if the detection of the fault condition does not clear or idle state of the source power supply sub-system cannot be achieved because of the fault condition, then the central controller may shut down the neutralizer power supplies or all the ion source system power supplies.

Figure 7:
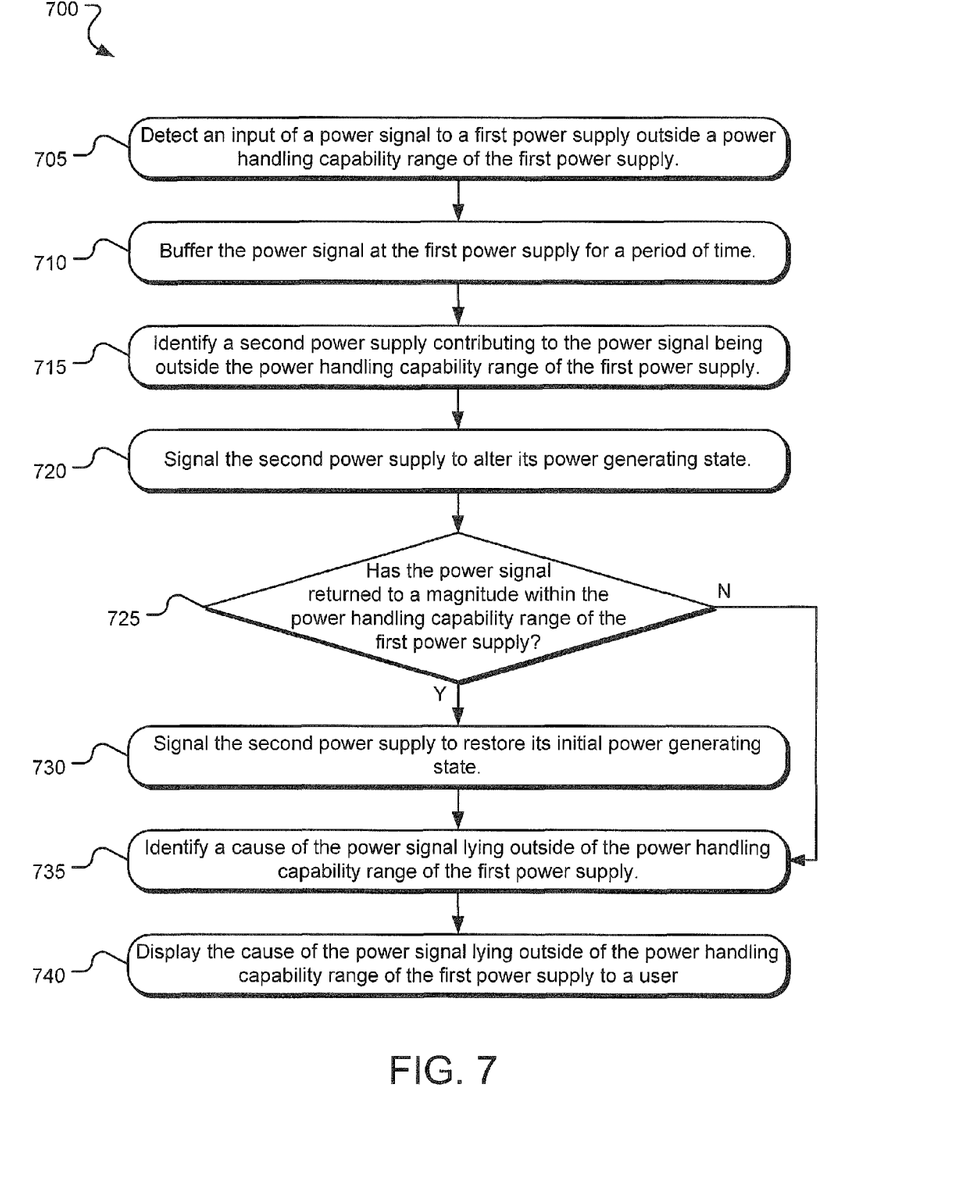
FIG. 7 illustrates an example flowchart depicting steps for managing power within an ion source system.

FIG. 7 illustrates an example flowchart 700 depicting steps for managing power within an ion source system. Various implementations of the presently disclosed technology does not utilize all the steps depicted in flowchart 700. Detecting operation 705 detects an input of a power signal to a first power supply that is outside of a power handling capability range of the first power supply. This may be referred to herein as a fault condition. In other implementations, the detecting operation 705 detects an input of a power signal to a first power supply that is outside a normal operating range of the first power supply and insufficient to power downstream power supplies. This may also be referred to herein as a fault condition. In one implementation, the power handling capability range (or normal operating range) is a current and/or voltage range. In another implementation, the power handling capability range (or normal operating range) is a voltage and/or current range at one or more of the input VAC line phases in a three phase system. Buffering operation 710 buffers the power signal at the first power supply for a period of time. The buffering prevents damage to the first power supply that may be caused by the power signal lying outside of the power handling capability range (or normal operating range) of the first power supply. The buffer may be sized appropriately to absorb an expected magnitude that the power signal is outside of the power handling capability range of the first power supply for the period of time. The period of time may be an expected quantity of time that the presently disclosed technology may take to bring the power signal to the first power supply back within the power handling capability range of the first power supply.

Identifying operation 715 identifies a second power supply that is contributing to the power signal being outside of the power handling capability range of the first power supply is identified. In other implementations, the identifying operation 715 identifies a second power supply that is overdrawing power from the first power supply. In one implementation, the second power supply is the sole contributor to the power signal being outside of the power handling capability range or overdrawing power from the first power supply. In other implementations, the second power supply is a partial contributor, with one or more additional power supplies also contributing to the power signal being outside of the power handling capability range or overdrawing power from the first power supply. Signaling operation 720 signals the second power supply to alter its power output. In some implementations, altering the power output of the second power supply includes reducing its power output, thereby decreasing or eliminating the overdraw of power from the first power supply. In one implementation, the first power supply directly signals (e.g., via an interrupt) the second power supply to reduce or eliminate its power output. In another implementation, the first power supply sends an interrupt signal to a central controller that signals the second power supply to reduce or eliminate its power output. Whether the central controller is involved in the signaling operation 720 may depend on the speed in which the first power supply will be damaged. For example, if there is insufficient time for the first power supply to signal to the central controller, the first power supply may instead signal the second power supply directly to alter its power output.

Decision operation 725 determines if the power signal has returned to a magnitude within the power handling capability range (or normal operating range) of the first power supply (i.e., the fault has cleared). If so, operation 730 signals the second power supply to restore its initial power output. Often, a spike or reduction in the power signal is temporary and thus the second power supply may restore its initial power output when the temporary power spike or reduction has subsided. If the power signal has not returned to a magnitude within the power handling capability range (or normal operating range) of the first power supply, operation 730 is skipped.

Identifying operation 735 identifies a cause of the power signal lying outside of the power handling capability range (or normal operating range) of the first power supply. In some implementations, a central controller stores tables of potential combinations of faults that may yield the cause of a particular fault condition detected at the first power supply. Displaying operation 740 displays the cause of the power signal lying outside of the power handling capability range (or normal operating range) of the first power supply to a user. The user may utilize this information to perform repairs, track failures, and/or track downtime of the ion source system, for example.

Figure 8:
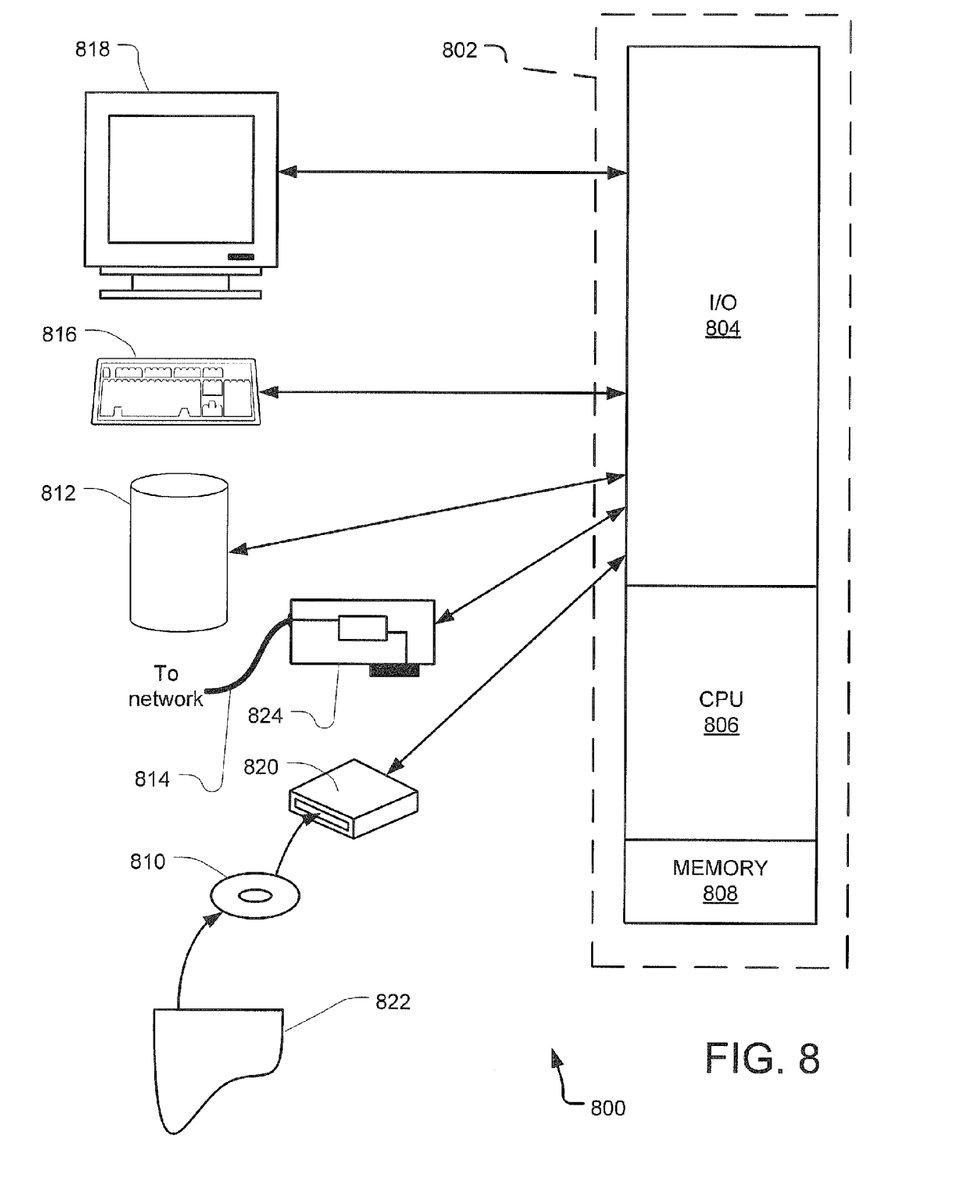
FIG. 8 illustrates an example computing system that can be used to implement the presently disclosed technology.

FIG. 8 illustrates an example computing system that can be used to implement the described technology. A general purpose computer system 800 is capable of executing a computer program product to execute a computer process. Data and program files may be input to the computer system 800, which reads the files and executes the programs therein. Some of the elements of a general purpose computer system 800 are shown in FIG. 8 wherein a processor 802 is shown having an input/output (I/O) section 804, a Central Processing Unit (CPU) 806, and a memory section 808. There may be one or more processors 802, such that the processor 802 of the computer system 800 comprises a single central-processing unit 806, or a plurality of processing units, commonly referred to as a parallel processing environment. The computer system 800 may be a conventional computer, a distributed computer, or any other type of computer. The described technology is optionally implemented in software devices loaded in memory 808, stored on a configured DVD/CD-ROM 810 or storage unit 812, and/or communicated via a wired or wireless network link 814 on a carrier signal, thereby transforming the computer system 800 in FIG. 8 to a special purpose machine for implementing the described operations.

The I/O section 804 is connected to one or more user-interface devices (e.g., a keyboard 816 and a display unit 818), a disk storage unit 812, and a disk drive unit 820. Generally, in contemporary systems, the disk drive unit 820 is a DVD/CD-ROM drive unit capable of reading the DVD/CD-ROM medium 810, which typically contains programs and data 822. Computer program products containing mechanisms to effectuate the systems and methods in accordance with the described technology may reside in the memory section 804, on a disk storage unit 812, or on the DVD/CD-ROM medium 810 of such a system 800. Alternatively, a disk drive unit 820 may be replaced or supplemented by a floppy drive unit, a tape drive unit, a solid state memory card, a programmable read-only memory chip or other storage medium drive unit. The network adapter 824 is capable of connecting the computer system to a network via the network link 814, through which the computer system can receive instructions and data embodied in a carrier wave. Examples of such systems include Intel and PowerPC systems offered by Apple Computer, Inc., personal computers offered by Dell Corporation and by other manufacturers of Intel-compatible personal computers, AMD-based computing systems and other systems running a Windows-based, UNIX-based, or other operating system. It should be understood that computing systems may also embody devices such as Personal Digital Assistants (PDAs), mobile phones, gaming consoles, set top boxes, embedded microcontrollers, etc.

When used in a LAN-networking environment, the computer system 800 is connected (by wired connection or wirelessly) to a local network through the network interface or adapter 824, which is one type of communications device. When used in a WAN-networking environment, the computer system 800 typically includes a modem, a network adapter, or any other type of communications device for establishing communications over the wide area network. In a networked environment, program modules depicted relative to the computer system 800 or portions thereof, may be stored in a remote memory storage device. It is appreciated that the network connections shown are exemplary and other means of and communications devices for establishing a communications link between the computers may be used.

In an example implementation, the central controller 358 of FIG. 3 may be incorporated as part of the operating system, application programs, or other program modules. Power supplies may be connected to one another and to the central controller via the LAN-networking environment. Further, tables of fault conditions (e.g., table 400 of FIG. 4) may be stored as program data in memory 808 or other storage systems, such as disk storage unit 812 or DVD/CD-ROM medium 810.

The embodiments of the invention described herein are implemented as logical steps in one or more computer systems. The logical operations of the present invention are implemented (1) as a sequence of processor-implemented steps executing in one or more computer systems and (2) as interconnected machine or circuit modules within one or more computer systems. The implementation is a matter of choice, dependent on the performance requirements of the computer system implementing the invention. Accordingly, the logical operations making up the embodiments of the invention described herein are referred to variously as operations, steps, objects, or modules. Furthermore, it should be understood that logical operations may be performed in any order, unless explicitly claimed otherwise or a specific order is inherently necessitated by the claim language.

The above specification, examples, and data provide a complete description of the structure and use of exemplary embodiments of the invention. Since many embodiments of the invention can be made without departing from the spirit and scope of the invention, the invention resides in the claims hereinafter appended. Furthermore, structural features of the different embodiments may be combined in yet another embodiment without departing from the recited claims.

What is claimed is:

1. A method of managing power within an ion source system comprising:
   detecting a fault at an input of a power signal to a first power supply of the ion source system, the fault comprising the power signal being outside a power handling capability range of the first power supply;
   identifying a second power supply of the ion source contributing to the fault; and
   signaling the second power supply to alter its power output.

2. The method of claim 1, wherein the input of the power signal is located at a power input side or a power output side of the first power supply.

3. The method of claim 1, further comprising:
   shutting the second power supply down; and
   buffering the power signal at the first power supply for a period of time greater than or equal to a period of time consumed by the detecting, identifying, signaling, and shutting down operations.

4. The method of claim 1, wherein the first power supply and the second power supply have different power handling capabilities.

5. The method of claim 1, wherein the signaling operation includes signaling the second power supply to shut down.

6. The method of claim 1, further comprising:
   detecting input of the power signal to the first power supply of the ion source system, wherein the fault has cleared; and
   signaling the second power supply to restore its initial power output, responsive to the cleared fault.

7. The method of claim 1, further comprising:
   identifying a cause of the fault.

8. The method of claim 7, further comprising:
   logging the cause of the fault.

9. The method of claim 7, further comprising:
   displaying the cause of the fault to a user.

10. The method of claim 1, wherein signaling the second power supply to alter its power output instructs the second power supply to perform one or more of the following: reduce output current, reduce output voltage, increase output current, increase output voltage, and remove output power of the second power supply.

11. The method of claim 1, wherein the signal for the second power supply to alter its power output travels directly from the first power supply to the second power supply.

12. The method of claim 1, wherein a processor physically separate from the first power supply and the second power supply but electrically connected to the first power supply and the second power supply performs the detecting, identifying, and signaling operations.

13. The method of claim 1, wherein the first power supply and the second power supply each include one of the following: a VAC-DC converter power supply, a filament cathode power supply, a discharge anode power supply, a beam grid power supply, an accelerator grid power supply, a decelerator grid power supply, a neutralizer filament cathode power supply, a neutralizer body power supply, and a neutralizer emitter power supply.

14. An ion source system comprising:
    a first power supply configured to receive a fault, the fault comprising a power signal outside of a power handling capability range of the first power supply;
    a second power supply contributing to the fault; and
    a controller configured to detect the fault at the first power supply, identify the second power supply, and signal the second power supply to alter its power output.

15. The system of claim 14, wherein the fault is located at a power input side or a power output side of the first power supply.

16. The system of claim 14, further comprising:
    a buffer configured to absorb all or a portion of the fault within a period of time greater than or equal to a period of time for the second power supply to alter its power output.

17. The system of claim 14, wherein the first power supply and the second power supply have different power handling capability ranges.

18. The system of claim 14, wherein the controller is further configured to signal the second power supply to shut down.

19. The system of claim 14, wherein the controller is further configured to detect input of the power signal within the power handling capability range of the first power supply and signal the second power supply to restore its initial power output, responsive to the power signal being within the power handling capability range of the first power supply.

20. The system of claim 14, wherein the controller is further configured to identify a cause of the fault.

21. The system of claim 20, wherein the controller is further configured to log the cause of the fault.

22. The system of claim 20, further comprising:
    a display configured to display the cause of the fault to a user.

23. The system of claim 14, wherein signaling the second power supply to alter its power output instructs the second power supply to perform one or more of the following: reduce output current, reduce output voltage, increase output current, increase output voltage, and remove output power of the second power supply.

24. The system of claim 14, wherein the controller is a part of the first power supply or the second power supply.

25. The system of claim 14, wherein the controller is physically separate from the first power supply and the second power supply but electrically connected to the first power supply and the second power supply.

26. The system of claim 14, wherein the first power supply and the second power supply each include one of the following: a VAC-DC converter power supply, a filament cathode power supply, a discharge anode power supply, a beam grid power supply, an accelerator grid power supply, a decelerator grid power supply, a neutralizer filament cathode power supply, a neutralizer body power supply, and a neutralizer emitter power supply.

27. One or more computer-readable non-transitory storage media encoding computer-executable instructions for executing on a computer system a computer process that manages power within an ion source system, the computer process comprising:
   detecting a fault at an input of a power signal to a first power supply of the ion source system, the fault comprising the power signal being outside of a power handling capability range of the first power supply;
   identifying a second power supply of the ion source contributing to the fault; and
   signaling the second power supply to alter its power output.

28. The one or more computer-readable media of claim 27, wherein the computer process further comprises:
   buffering the power signal at the first power supply for a period of time greater than or equal to a period of time consumed by the detecting, identifying, and signaling operations.

29. A system comprising:
   a power supply configured to receive a fault, the fault comprising the power outside of a power handling capability range of the first power supply, the power supply further configured to identify a second power supply contributing to the fault and send an interrupt signal to the second power supply to alter its power output in response to the fault.

* * * * *